US011272277B2

(12) United States Patent
Rohlich et al.

(10) Patent No.: US 11,272,277 B2
(45) Date of Patent: Mar. 8, 2022

(54) HOUSING WITH ACCESS PASSAGE

(71) Applicant: Axis AB, Lund (SE)

(72) Inventors: David Rohlich, Prague (CZ); Pavel Kral, Prague (CZ)

(73) Assignee: AXIS, AB, Lund (SE)

( * ) Notice: Subject to any disclaimer, the term of this patent is extended or adjusted under 35 U.S.C. 154(b) by 8 days.

(21) Appl. No.: 16/692,397

(22) Filed: Nov. 22, 2019

(65) Prior Publication Data

US 2020/0169798 A1 May 28, 2020

(30) Foreign Application Priority Data

Nov. 27, 2018 (EP) ..................................... 18208428

(51) Int. Cl.
| | |
|---|---|
| *H04R 1/02* | (2006.01) |
| *H04R 1/08* | (2006.01) |
| *H04R 1/04* | (2006.01) |
| *H05K 5/02* | (2006.01) |
| *G01J 1/02* | (2006.01) |

(52) U.S. Cl.
CPC .............. *H04R 1/083* (2013.01); *H04R 1/04* (2013.01); *H05K 5/0217* (2013.01); *G01J 1/0271* (2013.01)

(58) Field of Classification Search
CPC ........... H04R 1/02; H04R 1/025; H04R 1/026
USPC .......................................... 381/332–336, 388
See application file for complete search history.

(56) References Cited

U.S. PATENT DOCUMENTS

| | | | | |
|---|---|---|---|---|
| 3,987,258 A | * | 10/1976 | Tsutsui ..................... | H04R 1/44 381/334 |
| 4,010,335 A | * | 3/1977 | Yasuda ..................... | H04R 1/08 381/91 |
| 4,965,837 A | * | 10/1990 | Murayama ............. | H04R 1/023 181/144 |
| 2008/0310656 A1 | * | 12/2008 | Tsai ........................ | H04M 1/05 381/151 |
| 2010/0046785 A1 | * | 2/2010 | Schmidt ................. | H04R 1/025 381/387 |

(Continued)

FOREIGN PATENT DOCUMENTS

| | | |
|---|---|---|
| JP | 2007-116620 A | 5/2007 |
| JP | 2007-143079 A | 6/2007 |

OTHER PUBLICATIONS

Extended European Search Report dated May 14, 2019 for the European Patent Application No. 18208428.5.

*Primary Examiner* — Suhan Ni
(74) *Attorney, Agent, or Firm* — Volpe Koenig

(57) ABSTRACT

A housing for a device an outside and an inside, as well as an access passage for access from the outside of the housing to a component of the device inside the housing. The access passage comprises an outer opening section, and an inner drainage channel. The drainage channel is arranged below the outer opening section, which has vertical side walls extending inwardly from the outside of the housing. Each sidewall has a top width ($W_T$) and a bottom width ($W_B$), the top width ($W_T$) being narrower than the bottom width ($W_B$). The sidewalls provide a guiding surface for a liquid entering the access passage, such that the liquid is guided towards the drainage channel.

10 Claims, 3 Drawing Sheets

(56) References Cited

U.S. PATENT DOCUMENTS

2014/0161298 A1\* 6/2014 Russell-Clarke ...... H04R 1/021
                                                    381/380

\* cited by examiner

HOUSING WITH ACCESS PASSAGE

TECHNICAL FIELD

The present invention relates to a housing for a device. More specifically, it relates to a housing having an access passage for access from an outside of the housing to a component of the device inside the housing.

BACKGROUND

Various devices, particularly electronic devices, are provided with housings containing the components of the device. Such housings may serve several purposes. They may protect the components of the device from the environment around the device. This is often especially important if the device is arranged or used outdoors. The housing may also protect users of the device from possible dangers associated with the components of the device, e.g., protecting users from electric shock, or from injury from moving parts. The housing may also serve an aesthetic purpose, giving the device a pleasing appearance. Balancing all these needs is a difficult task when designing the device and its housing.

In some devices, it is necessary to have access to one or more components of the device from the outside, while at the same time providing adequate protection for the components from the environment around the device. For instance, door stations are often mounted outside the door of a building for enabling communication between a person wishing to enter the building and a person on the inside of the building in order to decide if the visitor should be allowed in. Such door stations may include a microphone for allowing the visitor to talk to the person inside the building. The microphone needs to be accessible to soundwaves from outside the housing. This could be achieved by placing the microphone on the outside of the housing or by providing a large opening in the housing in front of the microphone. However, the microphone also needs to be protected from the outside elements, including vandalism. This could be achieved by arranging the microphone inside the housing and using a housing with no large openings. Reconciling these requirements is a challenge for the designer of the door station.

SUMMARY

Providing a housing for a device including a component that needs to be accessible, but also needs to be protected from detrimental influence from outside would be beneficial.

Providing a housing that ensures that components of the device are accessible but protected and that any liquid entering the housing does not damage components of the device, but drains out of the housing would also be beneficial.

Providing a device that is protected from accumulation of liquid entering the device, and in which liquid entering the device is prevented from interfering with interaction from the outside with a component of the device would be desirable.

According to a first aspect, a housing for a device, the housing having an outside and an inside, includes an access passage for access from the outside of the housing to a component of the device inside the housing, wherein the access passage comprises: an outer opening section, and an inner drainage channel, the drainage channel being arranged below the outer opening section, the outer opening section having generally vertical side walls extending inwardly from the outside of the housing, each sidewall having a top width at a top of the sidewall and a bottom width at a bottom of the sidewall closer to the drainage channel, the top width being narrower than the bottom width, the sidewalls providing a guiding surface for a liquid entering the access passage, such that the liquid is guided towards the drainage channel. Such a housing makes it possible to protect the component of the device inside the housing from water and other influence for the outside, while still allowing access to the component. The shape of the sidewalls ensure that any water entering the housing through the outer opening is guided inwards and downwards towards the drainage channel.

As used herein, the term "access" encompasses various kinds of intangible physical access. Examples of access are audio access, such as soundwave access to a component in the form of a microphone or sound emitted by a beeper or speaker, or light access, such as light falling on a component in the form of a light sensor or light emitted by a component in the form of a light source. However, as used herein, "access" is not intended to include tangible access, such as access by a screw driver to a component in the form of a screw. Further, "access" does not encompass non-physical, logical access. Still, tangible or non-physical access to the component may be permitted as long as intangible physical access is also enabled.

In some embodiments, a cross section of the drainage channel is smaller than a cross section of the outer opening section. The decreasing cross section will increase the likelihood that water moves in the correct direction, towards the drainage channel. Surface tension and gravity will work together to lead the water away from the outer opening.

The housing may further comprise a guiding groove, arranged to guide the liquid from the outer opening section to the drainage channel. This makes it possible to guide the liquid to the drainage channel even if the drainage channel is not arranged directly below the outer opening section.

Further, a cross section of the guiding groove may be smaller than a cross section of the outer opening section and larger than a cross section of the drainage channel. Hereby, the liquid will be drawn towards the drainage channel by successively decreasing cross sections.

In some embodiments, a cross section of the drainage channel is rectangular. This reduces the risk of air bubbles blocking the drainage channel, thus improving drainage of liquid.

Each sidewall may be provided by a wedge-shaped wall portion. This is a practical way of providing the desired shape of the sidewalls.

According to a second aspect, a device comprises a housing according to the first aspect, and a component arranged inside the housing, wherein the component is accessible through the access passage. In such a device, the component may be well protected inside the housing, while still being accessible to a degree necessary for its use. Any water or other liquid entering the housing may be safely drained from the housing and a risk of liquid blocking the outer opening section is reduced.

The component may be an input component or an output component.

In some embodiments, the input component is a microphone. A microphone needs to be protected from, e.g., rain and vandalism, but also needs to be accessible to soundwaves from outside the device. By equipping the device with a housing according to the first aspect, these requirements may both be met.

The component may be arranged above the outer opening section. In this manner, even if liquid entering the outer opening section does not immediately drain out of the housing through the drainage channel, the risk that the component will be impacted by the liquid is reduced.

A further scope of applicability of the present embodiment will become apparent from the detailed description given below. However, it should be understood that the detailed description and specific examples, while indicating preferred embodiments, are given by way of illustration only, since various changes and modifications will become apparent to those skilled in the art from this detailed description.

Hence, it is to be understood that the embodiments are is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a", "an", "the", and "said" are intended to mean that there are one or more of the elements unless the context clearly dictates otherwise. Thus, for example, a reference to "an object" or "the object" may include several objects, and the like. Furthermore, the word "comprising" does not exclude other elements or steps.

BRIEF DESCRIPTION OF THE DRAWINGS

The embodiments will now be described in more detail by way of example and with reference to the accompanying schematic drawings, in which.

DETAILED DESCRIPTION OF EMBODIMENTS

Figure 1:
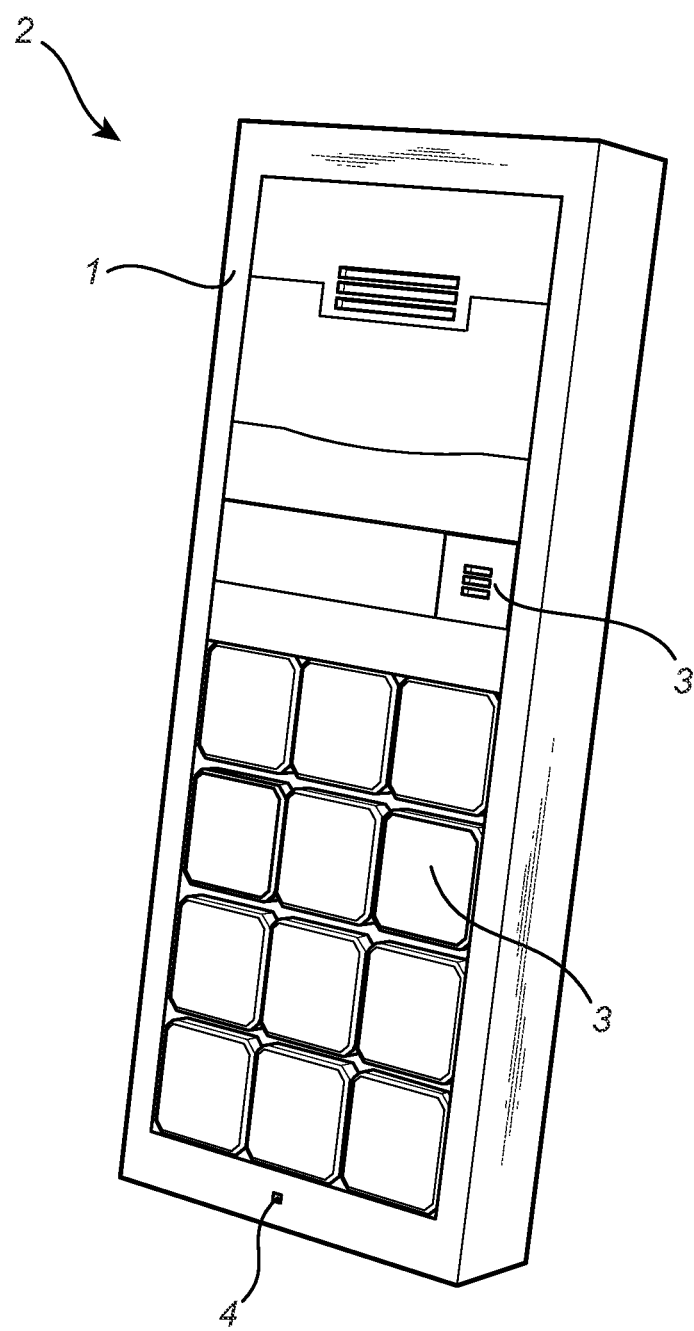
FIG. 1 is a front view of a door station having a housing according to an embodiment.

In FIG. 1, a housing 1 is shown. In the example shown, the housing 1 is the housing of a door station. The door station is generally indicated by the reference numeral 2 and only some components of the door station 2 will be discussed here.

The door station 2 has a number of buttons 3 for initiating communication with persons inside a building at which the door station 2 is used. Further, the door station has an outer opening section 4. As may be seen in FIG. 3, the outer opening 4 is part of an access passage 5, through which a microphone 6 inside the housing 1 of the door station 2 is accessible. Sound is hereby able to reach the microphone 6 from the outside of the door station 2.

If the door station 2 is mounted outdoors, there is a risk that rain and snow will fall on it, and therefore a risk that water enters the outer opening 4. It may be noted that there is a risk of water entering the outer opening 4 even if the door station 2 is mounted indoors, e.g., if the housing is cleaned with a wet cloth or sponge. In the following, water entering the housing will be discussed, but the skilled person will realise that other liquids entering the housing may be equally relevant.

Water and other liquids may be harmful to components inside the housing 1, and it is therefore important to avoid accumulation inside the housing 1. In order to ensure that water does not accumulate, the access passage 5 is provided with an inner drainage channel 7 extending downwards from the outer opening section 4 out through a bottom portion 8 of the housing 1. Furthermore, even if the amount of water entering the housing 1 is small, there is a risk that a water drop gets stuck in the outer opening section 4 unless the water drains away properly. If water stays in the outer opening section, it may block the access passage 5, such that sound from outside the door station cannot reach the microphone 6, thereby making communication difficult.

Figure 2A:
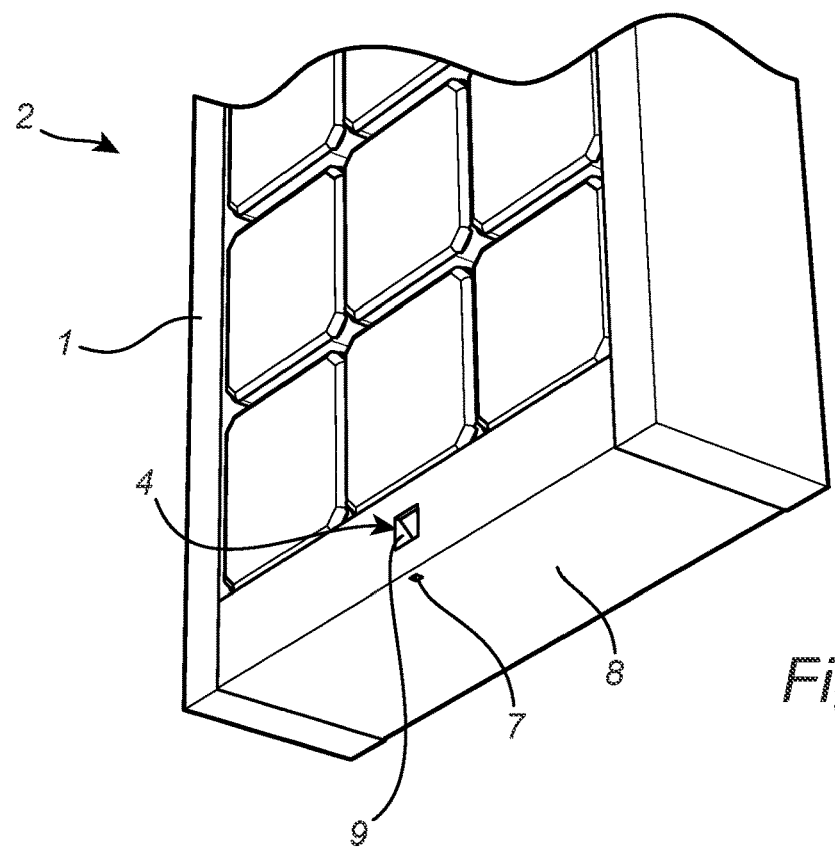
FIG. 2 is a perspective view of a portion of the housing of FIG. 1.
Figure 2B:
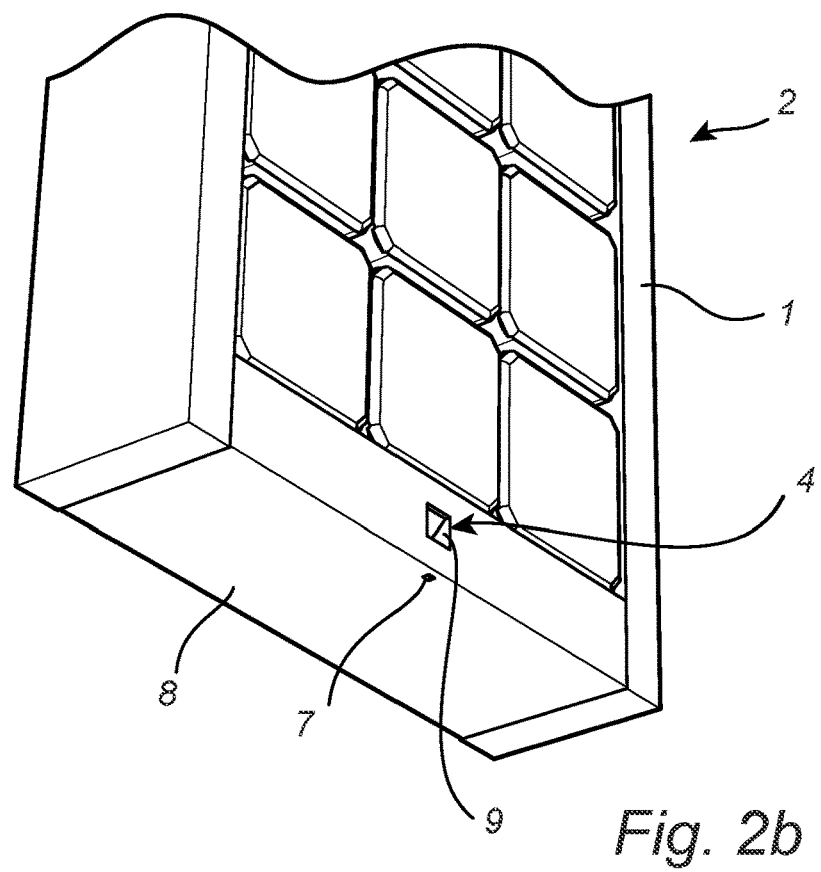
Figure 3:
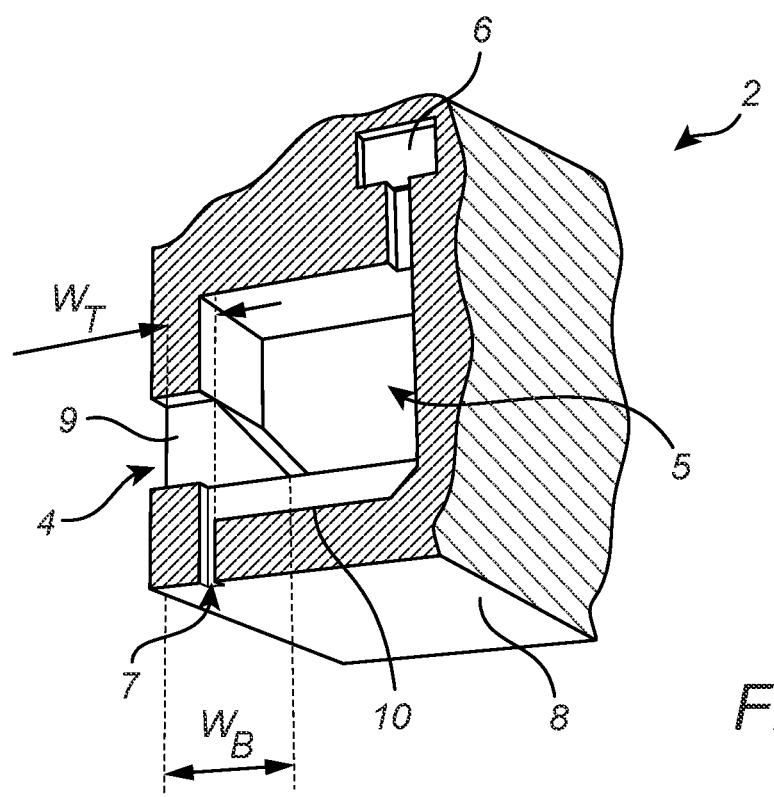
FIG. 3 is an enlarged cross-sectional view of the housing portion of FIG. 2, showing parts of the device inside the housing.

As may be seen partially in FIG. 2, and more clearly in FIG. 3, the outer opening section 4 has vertical side walls 9, which extend from the outside of the housing 1 and into the housing 1. Only one such sidewall 9 is visible in the drawings, but in this embodiment, the access passage 5 is generally symmetrical, such that sidewalls 9 are formed inside both sides of the outer opening 4. The sidewalls 9 are tapered, such that they have a top width $W_T$ at a top of the outer opening section 4 which is narrower than a bottom width $W_B$ at a bottom of the outer opening section 4, i.e. closer to the drainage channel 7. The sidewalls 9 may be described as wedge-shaped portions of the wall around the outer opening 4.

The sidewalls 9 provide a guiding surface for water and other liquids that enter the access passage 5. If a drop of water enters the outer opening section 4, surface tension and gravity will in combination with the shape of the sidewalls guide the water down towards the drainage channel 7. This makes it possible to avoid that water blocks the outer opening section 4. Thereby it is possible to ensure that sound from outside the door station 2 can reach the microphone 6. At the narrow top of the sidewalls 9, any water adhering in the outer opening 4 is likely to form a layer thin enough to easily break when acted on by a force, such as gravity. Further, as the sidewalls 9 are wider at the bottom, a thicker layer of water can form there, dragging any water adhering in the outer opening down and overcoming surface tension at the top of the sidewalls 9.

Below the sidewalls 9 of the outer opening section 4, a guiding groove 10 is formed. The guiding groove 10 is intended to guide the water away from the side walls 9 towards the drainage channel 7. To enhance the guiding ability of the guiding groove 10, the guiding groove 10 has a cross section which is smaller than a cross section of the outer opening section 4. In this manner, surface tension and gravity will pull the water away from the outer opening section 4 towards the drainage channel 7.

Similarly, to ensure that water is guided into the drainage channel 7 from the guiding groove 10, a cross section of the drainage channel 7 is smaller than the cross section of the guiding groove 10. The drainage channel 7 is rectangular or preferably square in cross section. Hereby, the risk that an air bubble blocks the entire cross section of the drainage channel is reduced. As air bubbles are round, and they thereby do not fill the entire rectangular cross section, liquid may still drain by means of the corners of the rectangular cross section, thus passing around the air bubble. This in turn improves the draining capability of the drainage channel 7.

The microphone 6 is arranged above the outer opening section 4. Hereby, the microphone 6 may be well protected even in the event that an unexpectedly large volume of water enters the outer opening section, such that draining takes time and water temporarily accumulates in the access passage 5.

Surfaces of the outer opening section 4, sidewalls 9, guiding groove 10, and drainage channel 7 are preferably made from a non-hydrophobic material. The use of non-hydrophobic material increases the tendency of water to enter the drainage channel and be drained out of the housing. Additionally, hydrophobic materials may be expensive and the configuration of the outer opening section 4, side walls 9, guiding groove 10, and drainage channel makes them unnecessary or even undesired.

It will be appreciated that a person skilled in the art can modify the above described embodiments in many ways and still gain the benefits as shown in the embodiments above. As an example, in the embodiment shown, the outer opening section has a rectangular cross section, but it may instead be, e.g., circular. In such case, the shape of the sidewalls needs to be adapted to the cross-sectional shape of the outer opening section.

Although the sidewalls are described as being vertical, the skilled person will realise that they need not be strictly vertical, but only vertical enough that drops of water will flow downwards along them.

The housing may be formed without the guiding groove. The drainage channel will in such variants be arranged directly below the sidewalls of the outer opening section.

In the example shown in the drawings, the drainage channel has a square cross section. It may have another rectangular cross section, or any other non-round cross section that would allow liquid to drain even in the presence of possible air bubbles. The cross section may, for instance, be polygonal, or be generally circular, but with a rectangular sub-portion along the length of the drainage channel for allowing liquid to drain unhindered by air bubbles.

The description above has mainly been directed to a door station in which a microphone needs to be protected but accessible. In the door station, the microphone is protected from water and it is ensured that water does not block the access passage. The same solution may, however, be applied to other components and to other devices as well. For instance, the component may be another input device, such as a light sensor that needs to be accessible by light, a PIR detector that needs to be accessible by infrared radiation, or an image sensor that needs to be accessible by visible light or infrared radiation. Further, the component may be an output device, such as a light source that needs to be able to emit light outside the housing, or a sound-emitting component that needs to transmit sound outside the housing.

The device may be any kind of device that has to be capable of being used or mounted in a position where it risks being subject to detrimental effects from, e.g., moisture, rain, snow, sunlight, or vandalism. The device may, for instance, be a monitoring camera, a speaker, a physical access controller, a card reader, a luminaire, or a traffic light.

Several components may be arranged inside the same outer opening section. Further, the device may have two or more components, each being arranged inside a separate outer opening section.

Thus, the teachings should not be limited to the shown embodiments but should only be defined by the appended claims.

The invention claimed is:

1. A housing for a device, the housing having an outside and an inside, the housing further having an access passage for access from the outside of the housing to a component of the device inside the housing, wherein the access passage comprises:
    an outer opening section providing access from outside of the housing to the component, and
    an inner drainage channel inside the housing connecting the outer opening section to a drainage opening in the housing,
    the drainage channel being arranged below the outer opening section,
    the outer opening section having vertical side walls extending inwardly from the outside of the housing,
    each sidewall having a top width at a top of the sidewall and a bottom width at a bottom of the sidewall closer to the drainage channel, the top width being narrower than the bottom width,
    the sidewalls providing a guiding surface for a liquid entering the access passage, such that the liquid is guided towards the drainage channel.

2. The housing according to claim 1, wherein a cross section of the drainage channel is smaller than a cross section of the outer opening section.

3. The housing according to claim 1, further comprising a guiding groove, arranged to guide the liquid from the outer opening section to the drainage channel.

4. The housing according to claim 3, wherein a cross section of the guiding groove is smaller than a cross section of the outer opening section and larger than a cross section of the drainage channel.

5. The housing according to claim 1, wherein a cross section of the drainage channel is rectangular.

6. The housing according to claim 1, wherein each sidewall is provided by a wedge-shaped wall portion.

7. A device comprising a housing according to claim 1, and a component arranged inside the housing, wherein the component is accessible through the access passage.

8. The device according to claim 7, wherein the component is an input component or an output component.

9. The device according to claim 8, wherein the input component is a microphone.

10. The device according to claim 7, wherein the component is arranged above the outer opening section.

* * * * *